US012687785B2

(12) United States Patent (10) Patent No.: US 12,687,785 B2
Chen et al. (45) Date of Patent: Jul. 21, 2026

(54) LITHOGRAPHY SYSTEM AND METHODS

(71) Applicant: Taiwan Semiconductor Manufacturing Co., Ltd., Hsinchu (TW)

(72) Inventors: Ming-Hsin Chen, Hsinchu (TW); Tzi-Wen Chen, Hsinchu (TW); Chi Yang, Hsinchu (TW); Yao-Tang Lin, Hsinchu (TW); Jian-Yuan Su, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 422 days.

(21) Appl. No.: 18/336,859

(22) Filed: Jun. 16, 2023

(65) Prior Publication Data

US 2024/0419082 A1 Dec. 19, 2024

(51) Int. Cl.
*G03F 7/00* (2006.01)
*H10P 76/20* (2026.01)
(52) U.S. Cl.
CPC ...... *G03F 7/70033* (2013.01); *G03F 7/70358* (2013.01); *G03F 7/70983* (2013.01); *H10P 76/2041* (2026.01)
(58) Field of Classification Search
CPC ............. G03F 7/70033; G03F 7/70358; G03F 7/70983; H01L 21/0274
See application file for complete search history.

(56) References Cited

U.S. PATENT DOCUMENTS

| | | | | |
|---|---|---|---|---|
| 2019/0196322 A1* | 6/2019 | Lin | | G03F 7/2004 |
| 2019/0258157 A1* | 8/2019 | Chen | | G03F 1/64 |
| 2021/0080824 A1* | 3/2021 | Ishikawa | | G03F 1/64 |
| 2022/0155675 A1* | 5/2022 | Malakhovsky | | G03F 7/709 |

FOREIGN PATENT DOCUMENTS

| | | |
|---|---|---|
| CN | 111258174 A | 6/2020 |
| CN | 114879450 A | 8/2022 |
| TW | 201712426 A | 4/2017 |
| TW | 202113466 A | 4/2021 |
| TW | 202321808 A | 6/2023 |

* cited by examiner

*Primary Examiner* — Georgia Y Epps

*Assistant Examiner* — Hanway Chang

(74) *Attorney, Agent, or Firm* — Seed Intellectual Property Law Group LLP

(57) ABSTRACT

A method includes: protecting a mask of a mask assembly by a frame thereon during translating the mask assembly to a position associated with a region of a substrate, the frame having height less than a focal plane associated with a selected particle size; directing extreme ultraviolet (EUV) radiation toward the mask; reflecting radiation carrying a pattern of the mask toward the mask layer; forming a feature of a semiconductor device in a layer underlying the mask layer according to the pattern.

20 Claims, 17 Drawing Sheets

220

225

230

250

X
Y

460

416

418

400

Z X

LITHOGRAPHY SYSTEM AND METHODS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
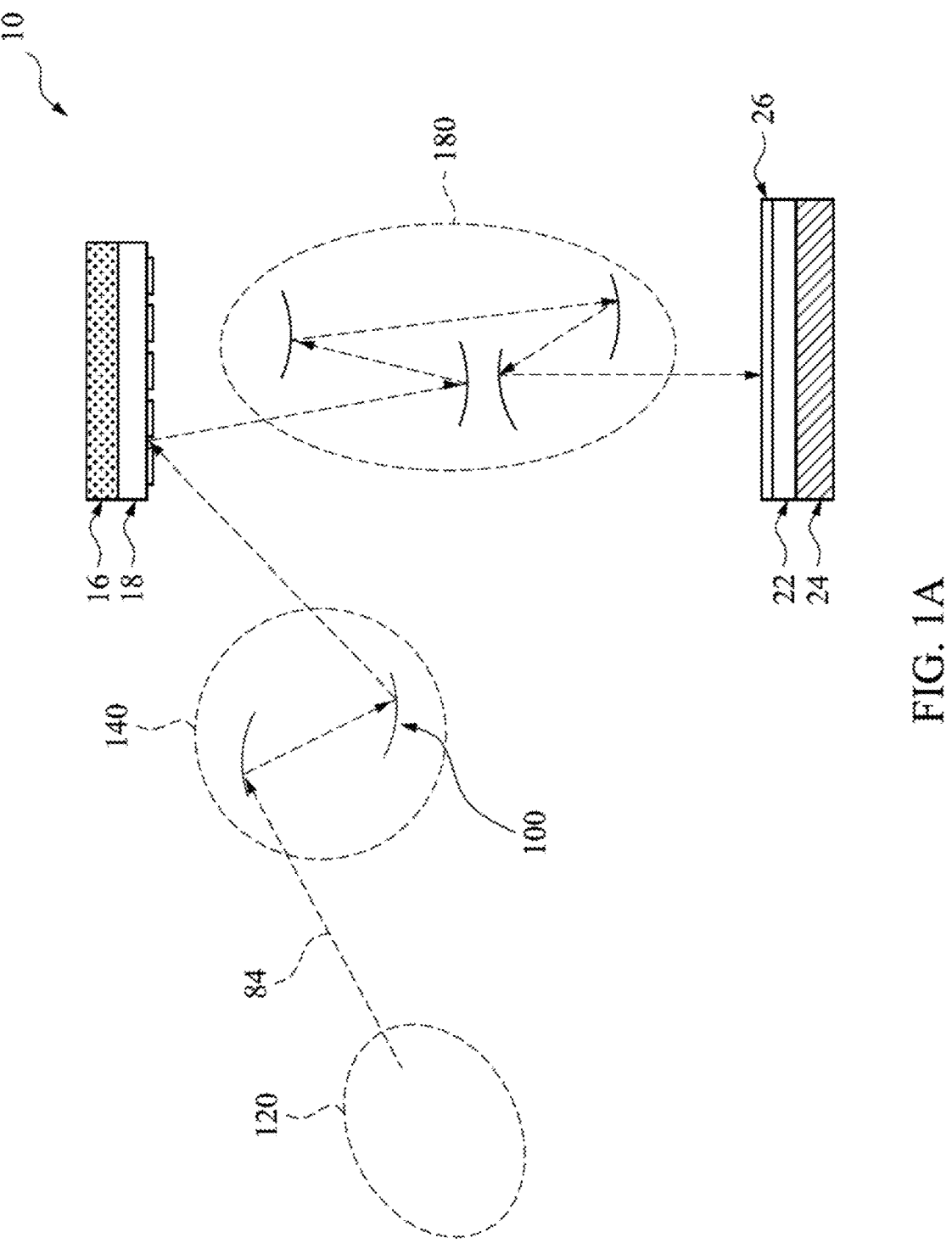
FIGS. 1A-1B are views of portions of a lithography scanner according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms such as "about," "roughly," "substantially," and the like may be used herein for ease of description. A person having ordinary skill in the art will be able to understand and derive meanings for such terms.

The present disclosure is generally related to lithography equipment for fabricating semiconductor devices, and more particularly to a pellicle-less frame that is part of a mask assembly. Dimension scaling (down) is increasingly difficult in advanced technology nodes. Lithography techniques employ ever shorter exposure wavelengths, including deep ultraviolet (DUV; about 193-248 nanometers), extreme ultraviolet (EUV; about 10-100 nanometers; particularly 13.5 nanometers), and X-ray (about 0.01-10 nanometers) to ensure accurate patterning at the scaled-down dimensions. In an EUV scanner, EUV light is generated by a light source, and reflected toward a wafer by multiple mirrors and a reflective mask. Only a fraction of the EUV light reaches the wafer, such that increasing intensity of EUV light generated by the light source is a topic of much interest.

The EUV scanner includes a mask assembly for shaping and reflecting light from a light source that is incident on the mask assembly. Use of a pellicle can prevent ingress of particles onto a reflecting surface of the mask assembly. The pellicle is typically a thin, transparent film that is suspended over a mask of the mask assembly by an offset structure. Because the mask assembly operates in a vacuum (or near-vacuum) environment, the offset structure includes holes to avoid rupture of the pellicle due to a pressure differential. Although the pellicle provides some protection to the mask from particles, the pellicle is not perfectly transparent, resulting in some energy absorption by the pellicle. Particle accumulation on the pellicle aggravates this effect. Even with holes in the offset structure, pellicle rupture remains a concern, leading to short life time of the pellicle, and increased tool downtime due to frequent replacement of the pellicle. Some particles may still ingress and attach to the backside of the pellicle, leading to inner pellicle defects. As such, EUV scanner productivity is reduced and the EUV scanner may be difficult to control.

In embodiments of this disclosure, a pellicle-less frame is included that functions similarly to a retaining wall in some respects. Fall-on particles are blocked by the frame or stick to the frame. Particle performance of the EUV mask and the EUV scanner are improved. The pellicle-less frame may be modified, such as heightened, thickened, changed in shape for fluid mechanics, and the like, to improve performance under a variety of operating conditions. The frame may have adhesive properties, such as a sticky surface or electrification.

FIG. 1A is a schematic and diagrammatic view of a lithography exposure system 10, in accordance with some embodiments. In some embodiments, the lithography exposure system 10 is an extreme ultraviolet (EUV) lithography system designed to expose a resist layer by EUV radiation, and may also be referred to as the EUV system 10. The EUV system 10 may also be referred to as an EUV scanner or lithography scanner. The lithography exposure system 10 includes a light source 120, an illuminator 140, a mask stage 16, a projection optics module (or projection optics box (POB)) 180 and a substrate stage 24, in accordance with some embodiments. The elements of the lithography exposure system 10 can be added to or omitted, and the disclosure should not be limited by the embodiment.

The light source 120 is configured to generate light radiation having a wavelength ranging between about 1 nm and about 100 nm in certain embodiments. In one particular example, the light source 120 generates an EUV radiation with a wavelength centered at about 13.5 nm. Accordingly, the light source 120 is also referred to as an EUV radiation source. However, it should be appreciated that the light source 120 should not be limited to emitting EUV radiation. The light source 120 can be utilized to perform any high-intensity photon emission from excited target fuel.

In various embodiments, the illuminator 140 includes various refractive optic components, such as a single lens or a lens system having multiple reflectors 100, for example lenses (zone plates) or alternatively reflective optics (for EUV lithography exposure system), such as a single mirror or a mirror system having multiple mirrors in order to direct light from the light source 120 onto the mask stage 16, particularly to a mask 18 secured on the mask stage 16. In embodiments in which the light source 120 generates light in the EUV wavelength range, reflective optics are employed. In some embodiments, the illuminator 140 includes at least two lenses, at least three lenses, or more.

The mask stage 16 is configured to secure the mask 18. In some embodiments, the mask stage 16 includes an electrostatic chuck (e-chuck) to secure the mask 18. One reason an e-chuck is beneficial is that gas molecules absorb EUV radiation and the e-chuck is operable in the lithography exposure system for the EUV lithography patterning that is maintained in a vacuum environment to avoid EUV intensity loss. In the present disclosure, the terms mask, photomask, and reticle are used interchangeably. In the present embodiment, the mask 18 is a reflective mask. One exemplary structure of the mask 18 includes a substrate with a suitable material, such as a low thermal expansion material (LTEM) or fused quartz. In various examples, the LTEM includes $TiO_2$ doped $SiO_2$, or other suitable materials with low thermal expansion. The mask 18 includes a reflective multilayer deposited on the substrate. The mask stage 16 is operable to translate in two horizontal directions, such as an X-axis direction and a Y-axis direction, so as to expose multiple different regions of the semiconductor wafer 22 to light having a pattern generated by the mask 18. The semiconductor wafer 22 may have a mask layer 26 thereon, which may be a photoresist layer that is sensitive to the light carrying the pattern of the mask 18.

The projection optics module (or projection optics box (POB)) 180 is configured for imaging the pattern of the mask 18 on to a semiconductor wafer 22 secured on the substrate stage 24 of the lithography exposure system 10. In some embodiments, the POB 180 has refractive optics (such as for a UV lithography exposure system) or alternatively reflective optics (such as for an EUV lithography exposure system) in various embodiments. The light directed from the mask 18, carrying the image of the pattern defined on the mask, is collected by the POB 180. The illuminator 140 and the POB 180 are collectively referred to as an optical module of the lithography exposure system 10. In some embodiments, the POB 180 includes at least six reflective optics.

In some embodiments, the semiconductor wafer 22 may be made of silicon or other semiconductor materials. Alternatively or additionally, the semiconductor wafer 22 may include other elementary semiconductor materials such as germanium (Ge). In some embodiments, the semiconductor wafer 22 is made of a compound semiconductor such as silicon carbide (SiC), gallium arsenic (GaAs), indium arsenide (InAs), or indium phosphide (InP). In some embodiments, the semiconductor wafer 22 is made of an alloy semiconductor such as silicon germanium (SiGe), silicon germanium carbide (SiGeC), gallium arsenic phosphide (GaAsP), or gallium indium phosphide (GaInP). In some other embodiments, the semiconductor wafer 22 may be a silicon-on-insulator (SOI) or a germanium-on-insulator (GOI) substrate.

In addition, the semiconductor wafer 22 may have various device elements. Examples of device elements that are formed in the semiconductor wafer 22 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes. In some embodiments, the semiconductor wafer 22 is coated with a resist layer sensitive to the EUV radiation. Various components including those described above are integrated together and are operable to perform lithography processes.

The lithography exposure system 10 may further include other modules or be integrated with (or be coupled with) other modules, such as a cleaning module designed to provide hydrogen gas to the light source 120. The hydrogen gas helps reduce contamination in the light source 120. Further description of the light source 120 is provided with reference to FIG. 1B.

Figure 1B:
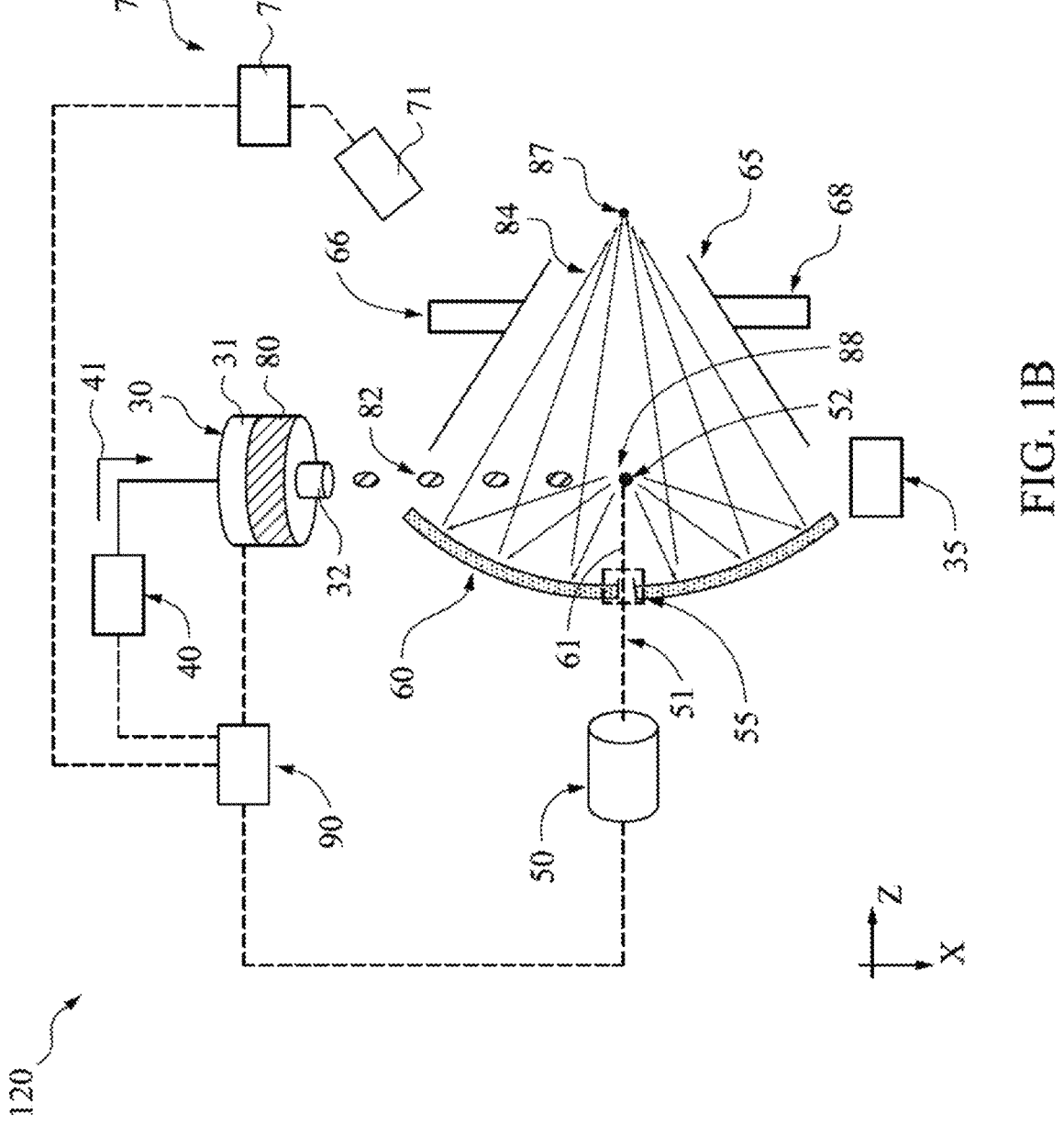

In FIG. 1B, the light source 120 is shown in a diagrammatical view, in accordance with some embodiments. In some embodiments, the light source 120 employs a dual-pulse laser produced plasma (LPP) mechanism to generate plasma 88 and further generate EUV radiation from the plasma. The light source 120 includes a droplet generator 30, a droplet receptacle 35, a laser generator 50, a laser produced plasma (LPP) collector 60, a monitoring device 70 and a controller 90. Some or all of the above-mentioned elements of the light source 120 may be held under vacuum. It should be appreciated that the elements of the light source 120 can be added to or omitted, and should not be limited by the embodiment.

The droplet generator 30 is configured to generate a plurality of droplets 82, which may be elongated, of a target fuel 80 to a zone of excitation at which at least one laser pulse 51 from the laser generator 50 hits the droplets 82 along an x-axis, as shown in FIG. 1B. In an embodiment, the target fuel 80 includes tin (Sn). In an embodiment, the droplets 82 may be formed with an elliptical shape. In an embodiment, the droplets 82 are generated at a rate of about 50 kilohertz (kHz) and are introduced into the zone of excitation in the light source 120 at a speed of about 70 meters per second (m/s). Other material can also be used for the target fuel 80, for example, a tin containing liquid material such as eutectic alloy containing tin, lithium (Li), and xenon (Xe). The target fuel 80 in the droplet generator 30 may be in a liquid phase.

The laser generator 50 is configured to generate at least one laser pulse to allow the conversion of the droplets 82 into plasma 88. In some embodiments, the laser generator 50 is configured to produce a laser pulse 51 to the lighting point 52 to convert the droplets 82 to plasma 88 which generates EUV radiation 84. The laser pulse 51 is directed through window (or lens) 55, and irradiates droplets 82 at the lighting point 52. The window 55 is formed in the sectional collector 60 and adopts a suitable material substantially transparent to the laser pulse 51. The droplet receptacle 35 catches and collects unused droplets 82 and/or scattered material of the droplets 82 resulting from the laser pulse 51 striking the droplets 82.

The plasma emits EUV radiation 84, which is collected by the collector 60. The collector 60 further reflects and focuses the EUV radiation 84 for the lithography processes performed through an exposure tool. In some embodiments, the collector 60 has an optical axis 61 which is parallel to the z-axis and perpendicular to the x-axis. The collector 60 may includes a single section, as shown, or at least two sections that are offset from each other in the z-axis direction. The collector 60 may further include a vessel wall 65 having first and second pumps 66, 68 attached thereto. In some embodiments, the first and second pumps 66, 68 include scrubbers configured to remove particulates and/or gases from the collector 60. The first and second pumps 66, 68 may be collectively referred to as "the pumps 66, 68" herein.

In an embodiment, the laser generator 50 is a carbon dioxide (CO2) laser source. In some embodiments, the laser generator 50 is used to generate the laser pulse 51 with single wavelength. The laser pulse 51 is transmitted through an optic assembly for focusing and determining incident angle of the laser pulse 51. In some embodiments, the laser pulse 51 has a spot size of about 200-300 μm, such as 225 μm. The laser pulse 51 is generated to have certain driving power to meet wafer production targets, such as a throughput of 125 wafers per hour (WPH). For example, the laser pulse 51 is equipped with about 23 kW driving power. In various embodiments, the driving power of the laser pulse 51 is at least 20 kW, such as 27 kW.

The monitoring device 70 is configured to monitor one or more conditions in the light source 120 so as to produce data for controlling configurable parameters of the light source 120. In some embodiments, the monitoring device 70 includes a metrology tool 71 and an analyzer 73. In cases where the metrology tool 71 is configured to monitor condition of the droplets 82 supplied by the droplet generator 30, the metrology tool may include an image sensor, such as a charge coupled device (CCD), complementary metal oxide semiconductor sensor (CMOS) sensor or the like. The metrology tool 71 produces a monitoring image including image or video of the droplets 82 and transmits the monitoring image to the analyzer 73. In cases where the metrology tool 71 is configured to detect energy or intensity of the EUV light 84 produced by the droplet 82 in the light source 12, the meteorology tool 71 may include a number of energy sensors. The energy sensors may be any suitable sensors that are able to observe and measure energy of electromagnetic radiation in the ultraviolet region.

The analyzer 73 is configured to analyze signals produced by the metrology tool 71 and outputs a detection signal to the controller 90 according to an analyzing result. For example, the analyzer 73 includes an image analyzer. The analyzer 73 receives the data associated with the images transmitted from the metrology tool 71 and performs an image analysis process on the images of the droplets 82 in the excitation zone. Afterwards, the analyzer 73 sends data related to the analysis to the controller 90. The analysis may include a flow path error or a position error.

In some embodiments, two or more metrology tools 71 are used to monitor different conditions of the light source 120. One is configured to monitor condition of the droplets 82 supplied by the droplet generator 30, and the other is configured to detect energy or intensity of the EUV light 84 produced by the droplet 82 in the light source 120. In some embodiments, the metrology tool 71 is a final focus module (FFM) and positioned in the laser source 50 to detect light reflected from the droplet 82.

The controller 90 is configured to control one or more elements of the light source 120. In some embodiments, the controller 90 is configured to drive the droplet generator 30 to generate the droplets 82. In addition, the controller 90 is configured to drive the laser generator 50 to fire the laser pulse 51. The generation of the laser pulse 51 may be controlled to be associated with the generation of droplets 82 by the controller 90 so as to make the laser pulse 51 hit each target 82 in sequence.

In some embodiments, the droplet generator 30 includes a reservoir 31 and a nozzle assembly 32. The reservoir 31 is configured for holding the target material 80. In some embodiments, one gas line 41 is connected to the reservoir 31 for introducing pumping gas, such as argon, from a gas source 40 into the reservoir 31. By controlling the gas flow in the gas line 41, the pressure in the reservoir 31 can be manipulated. For example, when gas is continuously supplied into the reservoir 31 via the gas line 41, the pressure in the reservoir 31 increases. As a result, the target material 80 in the reservoir 31 can be forced out of the reservoir 31 in the form of droplets 82.

Figure 2A:
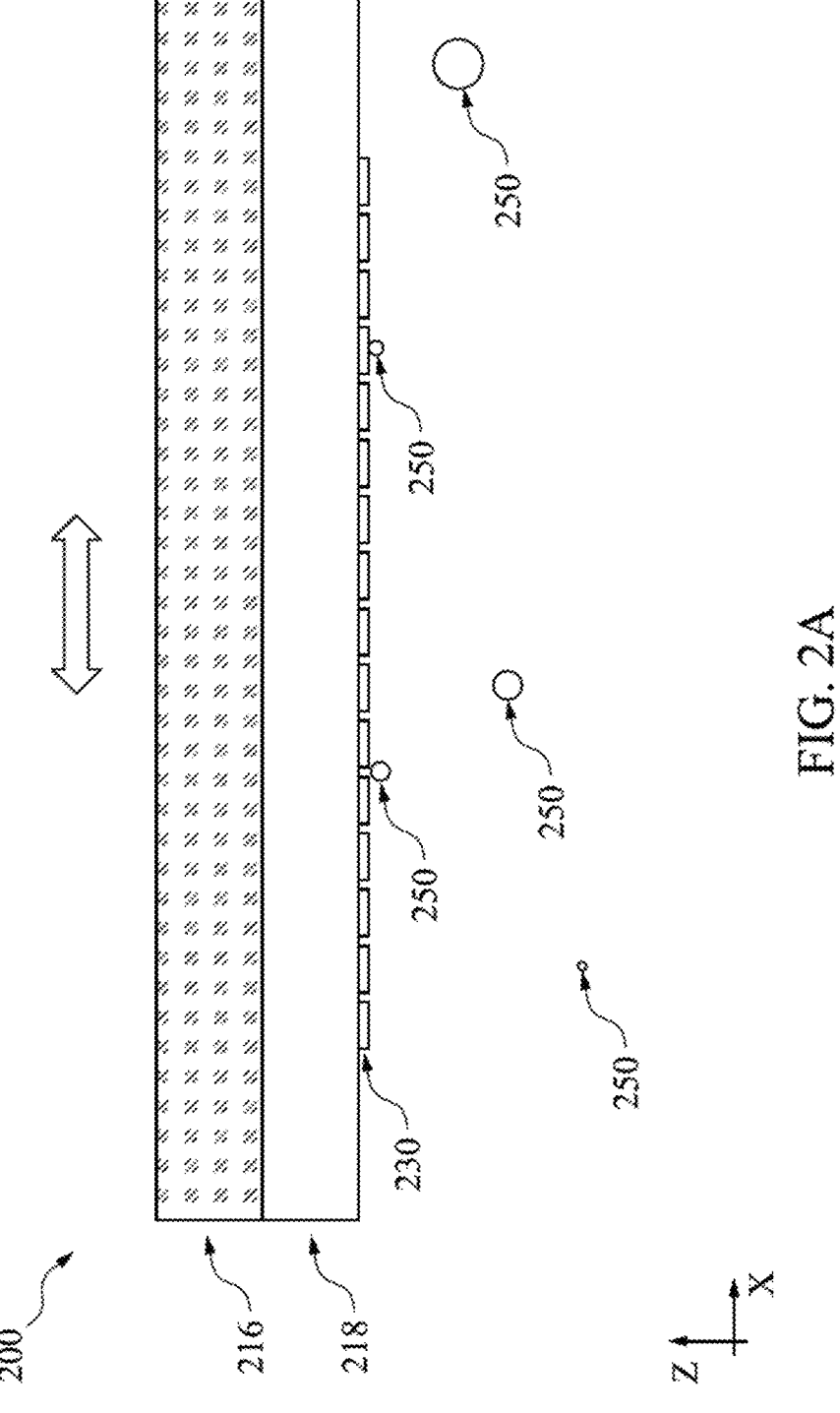
FIGS. 2A-2C are views of various embodiments of a mask assembly of the lithography scanner according to various aspects of the present disclosure.
Figure 2C:
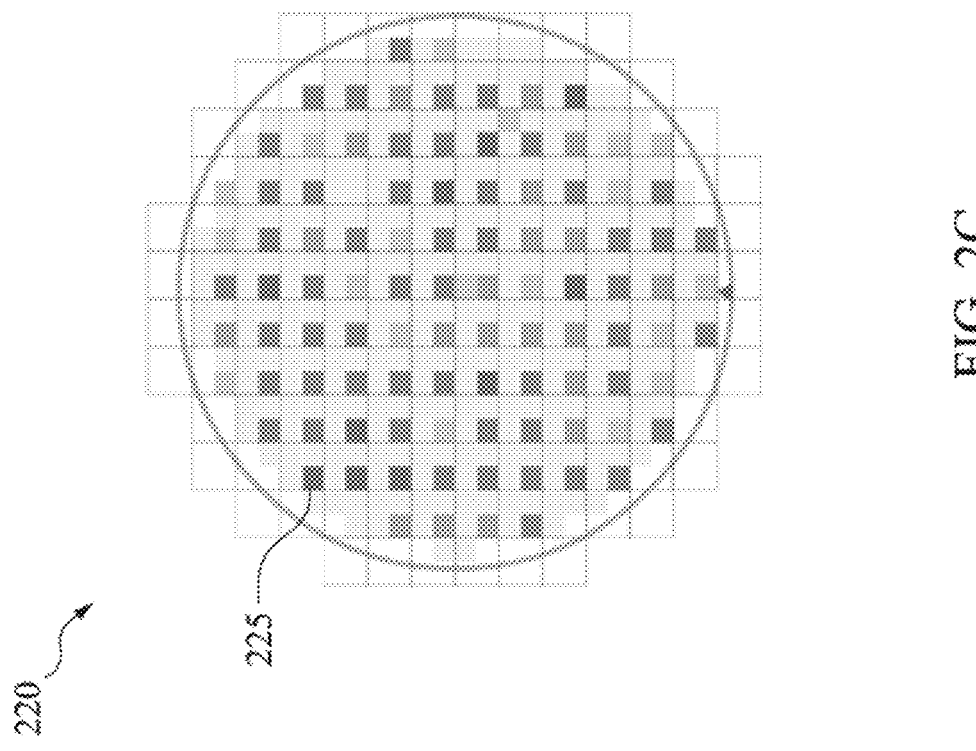
Figure 2B:
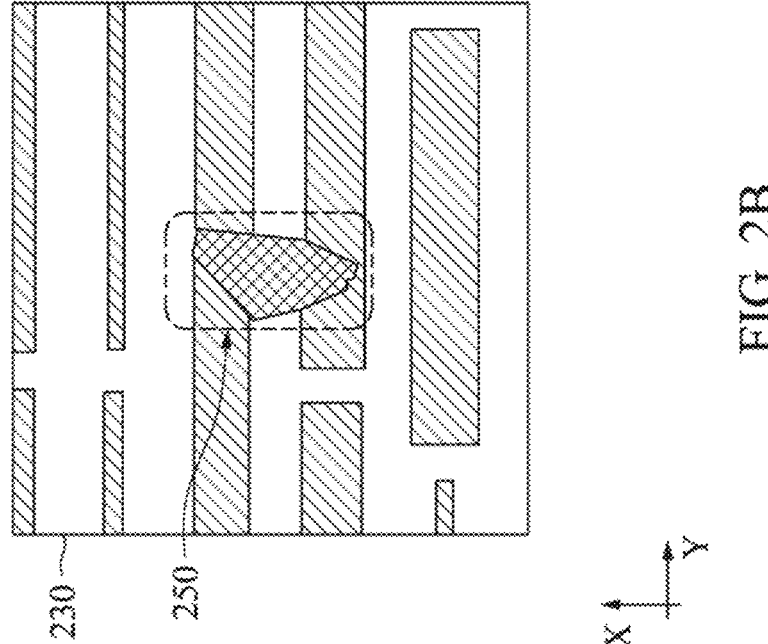

FIGS. 2A-2C are views of various embodiments of a mask assembly 200 of a lithography scanner according to various aspects of the present disclosure. FIG. 2A is a side view of a mask assembly 200. FIG. 2B is a top view of a mask pattern 230 of the mask assembly 200. FIG. 2C is a diagram illustrating exposure errors in regions 225 of a semiconductor wafer 220.

In FIG. 2A, the mask assembly 200 includes a mask stage 216 and a mask 218 attached thereto. The mask stage 216 and the mask 218 may be the mask stage 16 and the mask 18, respectively, of FIGS. 1A and 1B. The mask 218 includes mask patterns 230 that may be located in a layer of the mask 218 facing reflectors of the illuminator 140 and the POB 180 on either side of the mask assembly 200.

Particles 250 may be present in the lithography scanner. The particles 250 may include different types of particles generated by different sources in the lithography scanner. For example, the particles 250 may include tin particles generated by the light source 120 during formation of the plasma 88. The particles 250 may include SiC particles generated by movement of the mask assembly 200 in the X- and Y-axis directions. The particles 250 may include carbon particles generated by a pod or carrier used for transporting the mask 218 in and out of the lithography scanner. Other particles 250 having different material composition may be generated by other sources internal or external to the lithography scanner. One or more of the particles 250 may settle on the surface of the mask 218 on one or more mask pattern regions of the mask patterns 230.

FIG. 2B shows a view of the mask patterns 230 with a particle 250 thereon. The mask patterns 230 are exposed to the internal environment of the lithography scanner. While the mask assembly 200 is in the lithography scanner, the particle 250 may fall on the mask 218. The particle 250 may form a short circuit or bridge or merger between one or more pattern regions of the mask patterns 230. When the pattern of the mask 218 is transferred to a semiconductor wafer, an electrical defect, such as a short circuit or bridge or merger, may occur between features of the semiconductor wafer. For example, neighboring semiconductor fins or neighboring conductive traces may merge unintentionally, which may result in failure of an integrated circuit die formed in the semiconductor wafer.

FIG. 2C shows a diagrammatic view of a semiconductor wafer 220, which may be the semiconductor wafer 22 of FIGS. 1A and 1B. The view of FIG. 2C may be a diagram of an image generated by a metrology tool that analyzes the semiconductor wafer 220. During exposure, in which light carrying the pattern of the mask patterns 230 is incident on the semiconductor wafer 220, the particle 250 alters the pattern, which is transferred repeatedly onto the semiconductor wafer 220. As such, quality of the semiconductor wafer 220 is reduced, reducing productivity of the lithography scanner.

Figure 3B:
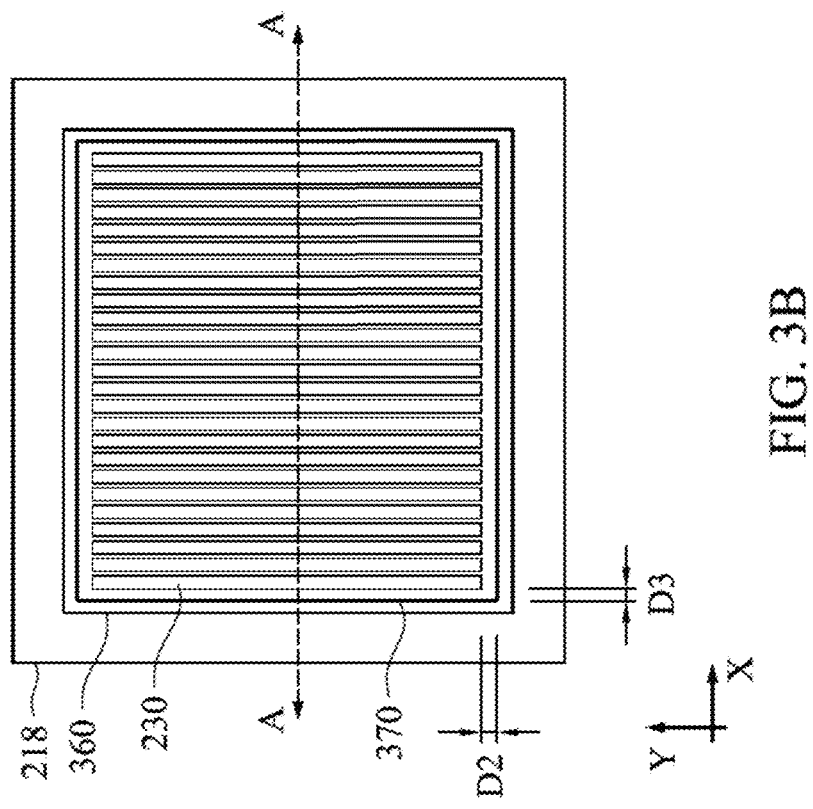
FIGS. 3A-3G are views illustrating use of a pellicle in accordance with various embodiments.
Figure 3A:
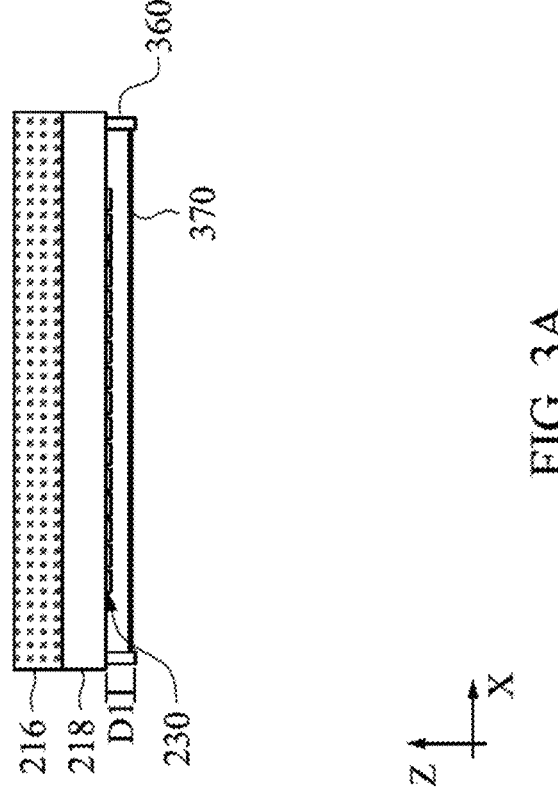

FIGS. 3A-3G are diagrammatic views showing a pellicle 370 and offset structure 360 installed on the mask assembly 200 to prevent the particles 250 from attaching to the mask 218. In FIGS. 3A and 3B, the pellicle 370 is shown suspended by the offset structure 360 over the mask patterns 230. The pellicle 370 may be a nanoscale thickness thin film that has high transparency (e.g., >90%) to EUV wavelengths (e.g., 13.5 nm). For example, the pellicle 370 may have thickness in the Z-axis direction in a range of about 1 nm to about 10 nm.

The offset structure 360 has height D1, which may be in a range of about 1 millimeter to about 3 millimeters, or more. The height D1 is about the same as a separation distance between the pellicle 370 and the mask patterns 230 in the Z-axis direction. The offset structure 360 may have rectangular (e.g., square) shape in the XY-plane, as shown in FIG. 3B. The offset structure 360 may be adjacent to the mask patterns 230 on four sides, as shown. The offset structure 360 may be offset horizontally in the X-axis and Y-axis directions from the mask patterns 230. For example, the offset structure 360 may be offset from the mask patterns by a second distance D2 in the Y-axis direction and by a third distance D3 in the X-axis direction. The distances D1, D2, D3 may be the same as each other. In some embodiments, one or more of the distances D1-D3 is different from others of the distances D1-D3. For example, the distance D1 may be in the range of about 1-3 millimeters as described above, and the second and third distances D2, D3 may be in a range of about 0.5 millimeters to about 10 millimeters. Mounting the pellicle 370 on the offset structure 360 can prevent mask defects formed by particles released by the lithography scanner. Generally, the distance D1 is sufficiently large such that any particle 250 less than a selected size (e.g., diameter less than about 500 nm) that settles on the outside surface of the pellicle 370 is far enough from a focus plane of incident light that the particle 250 does not cause a pattern defect.

Figure 3C:
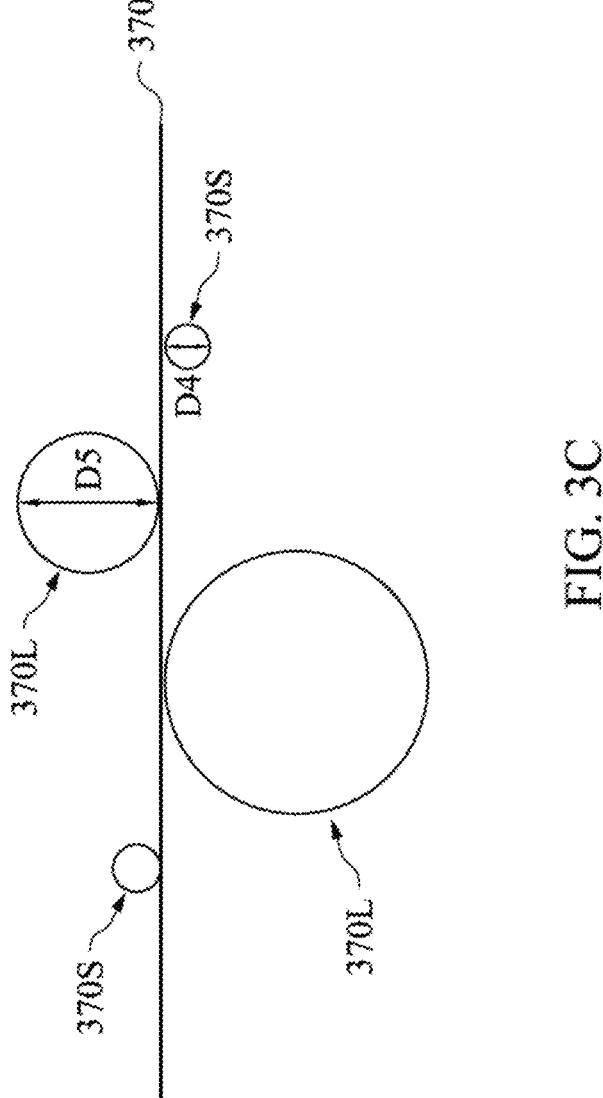

FIG. 3C illustrates presence of particles 370S, 370L on the pellicle 370. The particles 370S, 370L may include small particles 370S and large particles 370L. The small particles 370S may have diameter D4 that is less than a particle detection resolution of an inspection tool, and the large particles 370L may have a diameter D5 that is greater than the particle detection resolution. The particles 370S, 370L may be the same as the particles 250 described above with reference to FIGS. 2A-2G. Prior to mounting the pellicle 370 onto the mask assembly 200, an inspection process may be performed by the inspection tool for pellicle qualification. The qualification process may have a particle detection range or resolution outside of which, particles may not be identified. For example, the particle detection resolution may be about 300 nm. The diameter D4 of the small particles 370S may be less than 300 nm, such as less than 200 nm, less than 100 nm, less than 50 nm, or the like. The diameter D5 of the large particles 370L may be greater than 300 nm. As such, the large particles 370L on the inside and outside surfaces of the pellicle 370 may be identified by the inspection tool.

After mounting the pellicle 370, further inspection by the inspection tool may damage the pellicle 370, due to the pellicle 370 being under tension, making it easily ruptured by fluctuation and external vibration. As such, the small particles 370S may remain on the inside and outside surfaces of the pellicle 370 after the pellicle 370 is mounted to the mask assembly 200.

Figure 3D:
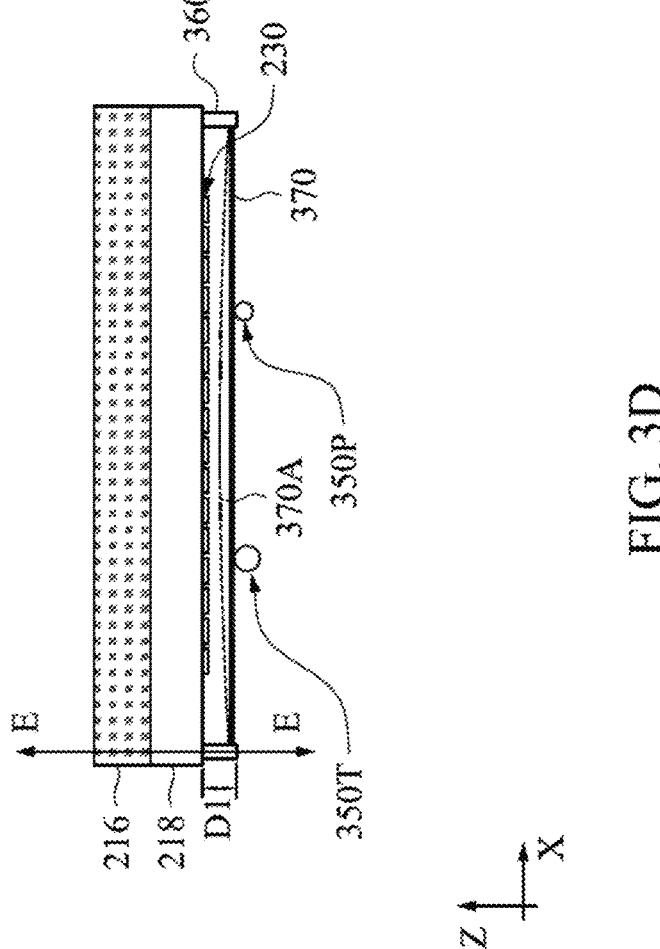

FIG. 3D illustrates the mask assembly 200 with the pellicle 370 mounted thereto after a period of operation. Generally, the pellicle 370 may be operated for a selected number of wafers before being replaced. For example, the pellicle 370 may be said to have a "lifetime" of about 10,000 wafers, about 15,000 wafers, or the like. During manufacture of integrated circuit dies on the semiconductor wafer 220, the mask assembly 200 may translate back and forth along the XY plane, and particles 350T, 350P may attach to the outside surface of the pellicle 370, as shown in FIG. 3D. The particles 350T, 350P may include tool particles 350T and pod particles 350P, among other particle types described above with reference to FIGS. 2A-2G. Over time, as the particles 350T, 350P accumulate on the pellicle 370, and due to repeated acceleration along the XY plane of the pellicle 370, the pellicle 370 may deform, as indicated by a dashed line 370A in FIG. 3D. Eventually, the pellicle 370 may rupture and is replaced.

Figure 3F:
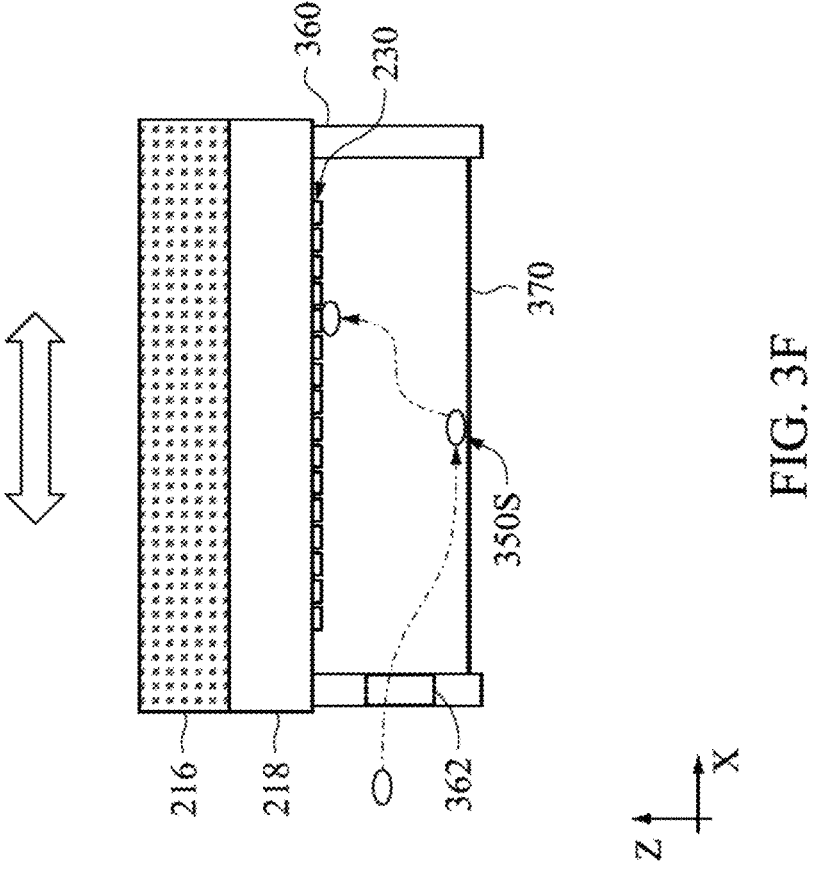
Figure 3E:
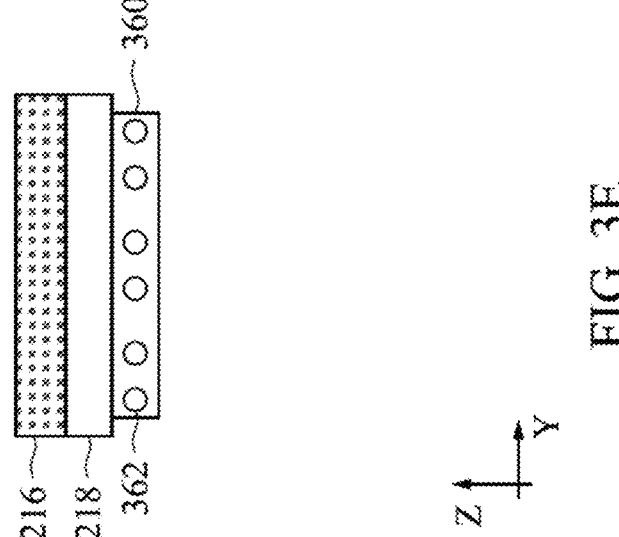

FIGS. 3E and 3F illustrate a side view of the offset structure 360 (FIG. 3E) and formation of inner pellicle defects due to openings or holes 362 in the offset structure 360 (FIG. 3F). Because the pellicle 370 is operated in a vacuum or near-vacuum environment, the holes 362 are present in the offset structure 360 that are beneficial to balance pressure between the space underneath the pellicle 370 and an internal environment of the lithography scanner in which the mask assembly 200 is disposed. Without the holes 362, the pellicle 370 would be prone to rupture in the vacuum or near-vacuum environment due to air pressure in the space underneath the pellicle 370 between the pellicle 370 and the mask patterns 230.

As shown in FIG. 3F, due to the holes 362 in the offset structure 360, a particle 350S may enter the space between the pellicle 370 and the mask patterns 230 through the holes 362. The particle 350S may settle on the inside surface of the pellicle 370, then may fall and settle on the mask patterns 230. The particle 350S illustrated in FIG. 3F may be referred to as an "inner pellicle defect." The inner pellicle defect is difficult to detect, and may lead to significant reduction of yield.

Figure 3G:
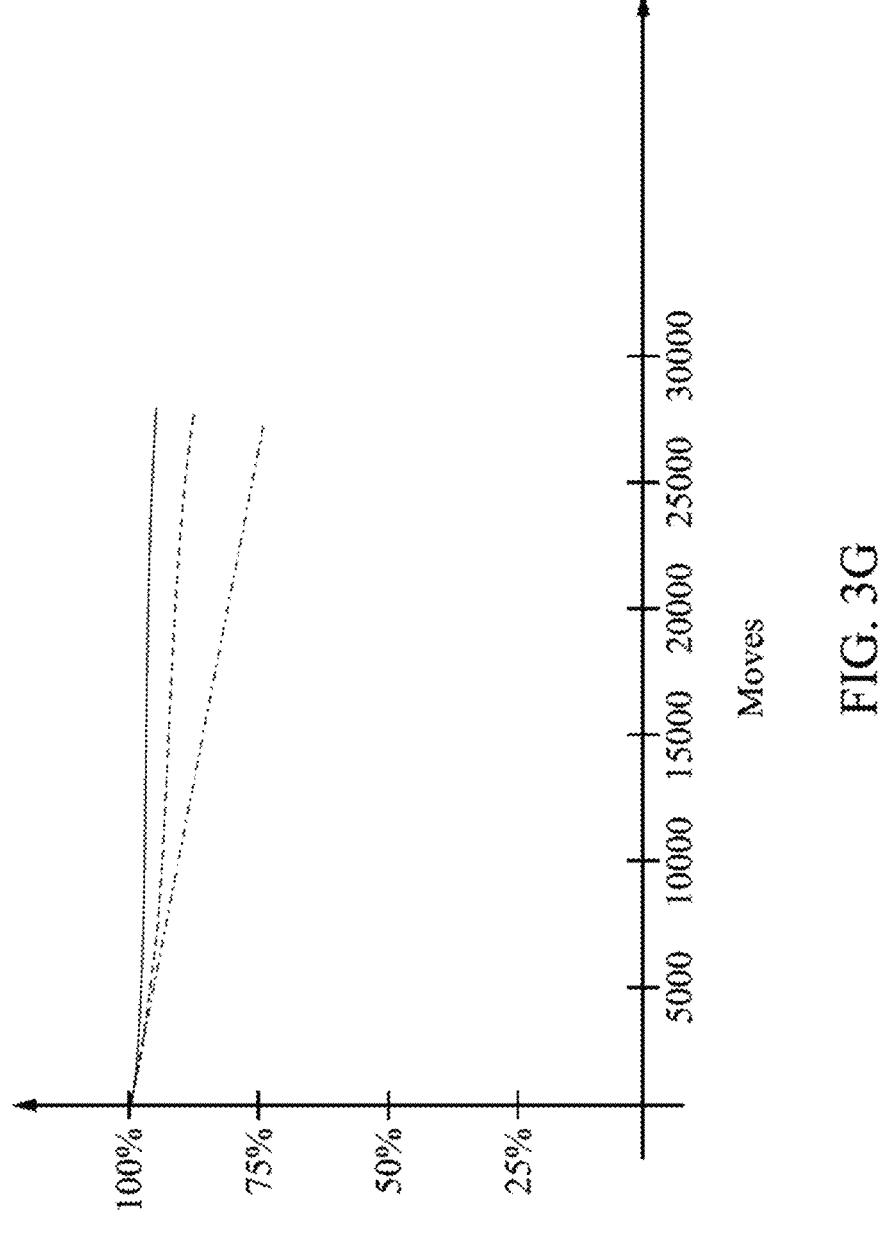

FIG. 3G is a diagram that illustrates loss of output power of light incident on the semiconductor wafer 220 relative to number of moves of the mask assembly 200 during processing of wafers. For example, output power of the light source 120 may be about 250 Watts, and after 20,000 moves of the mask assembly 200, due to accumulation of particles on the pellicle 370, effective output power may be reduced by about 5% to about 238 Watts. As shown in FIG. 3G, decay of the pellicle 370 may vary significantly from pellicle to pellicle, batch to batch, lot to lot, or the like, which may increase difficulty in estimating output power and controlling for (E.g., compensating for) the reduction in output power relative to number of moves. For example, if decay of the output power over the lifetime of the pellicle 370 were well known, exposure time could be increased based on the decay relative to the number of moves.

FIGS. 4A-4G are diagrams illustrating a mask assembly 400 including a pellicle-less frame 460 (or "the frame 460") in accordance with various embodiments. The mask assembly 400 including the pellicle-less frame 460 may be modified to suit a variety of processing environments, for example, by increasing or reducing height or thickness thereof, so as to improve fluid mechanics and the like. The frame that blocks particles, the frame 460 may be sticky and/or electrified. The frame 460 is shown in side view. In top view, the frame 460 may have similar profile to the offset structure 360 illustrated in FIG. 3B, namely, the frame 460 may be rectangular (e.g., square) and may be adjacent to the mask patterns 230 and offset therefrom by second and third distances D2, D3. Because the frame 460 is different in many respects from the offset structure 360, values of the distances D1, D2, D3 may be different from those of the offset structure 360, as will be described in greater detail below.

Figure 4A:
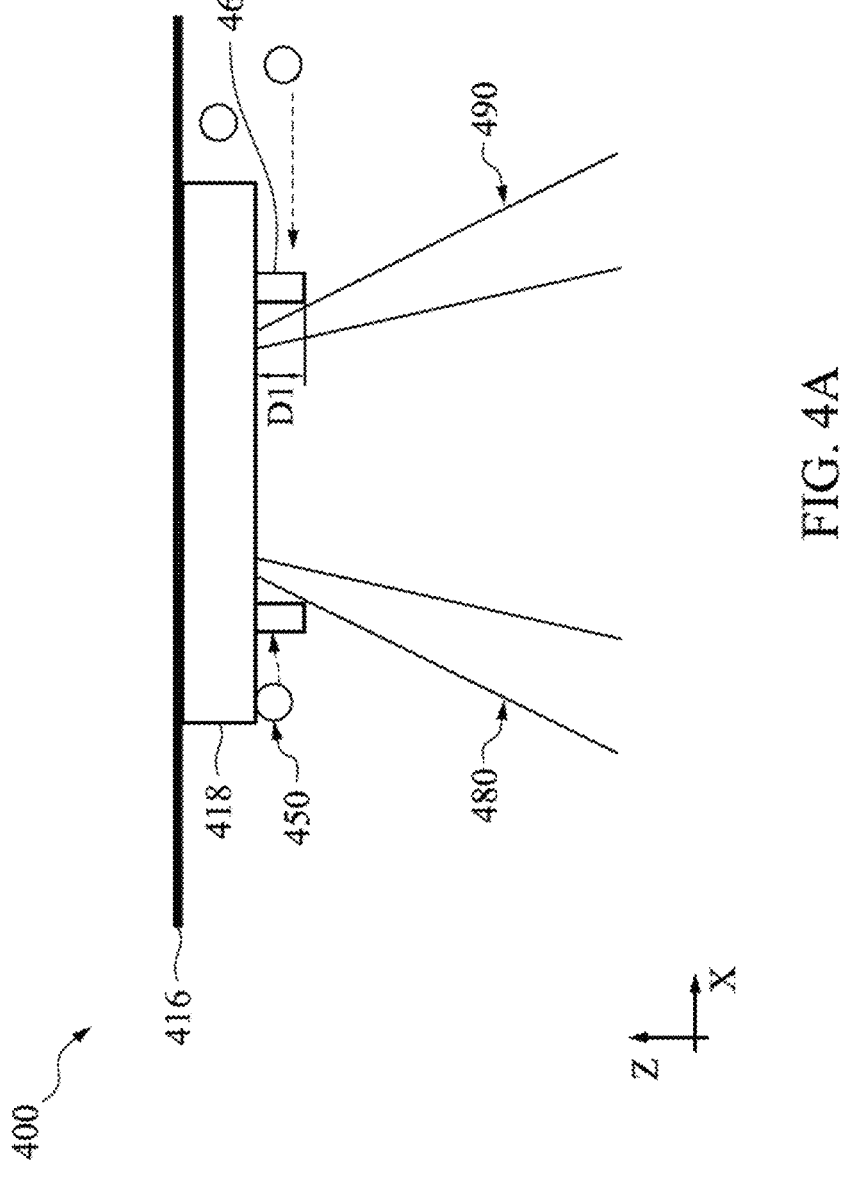
FIGS. 4A-4G are views illustrating use of a pellicle-less frame in accordance with various embodiments.

In FIG. 4A, the frame 460 is attached to a mask 418, which is mounted to a mask stage 416. The mask 418 may be the mask 18 and/or the mask 218. The mask stage 416 may be the mask stage 16 and/or the mask stage 216. The mask stage 416 may be or include an e-chuck, and the mask 418 may be held in place on the mask stage 416 by electromagnetic force. The frame 460 has height D1 that may be in a range that is different from the height D1 of the offset structure 360. For example, the height D1 of the frame 460 may be less than about 1.5 millimeters (mm). In some embodiments, the height D1 of the frame 460 is less than 1 mm, less than 0.5 mm, less than 0.1 mm, or another suitable value. The frame 460 is advantageous to block particles that are generally in the sub-micron regime, e.g., having diameter less than about 1000 nm, and the frame 460 does not include a pellicle to which particles may adhere. As such, the height D1 of the frame 460 may be selected without consideration for the focal plane of the incident light, and can be less than the height D1 of the offset structure 360. The reduced height D1 of the frame 460 is also advantageous to avoid blocking incident and exiting light 480, 490 at edges of the mask patterns of the mask 418. As such, the frame 460 may be offset from the mask patterns by second and third distances D2, D3 that are less than the second and third distances D2, D3 of the offset structure 360.

The frame 460 may be a conductive or semiconductive material. In some embodiments, the material is or includes steel (e.g., stainless steel), aluminum, molybdenum, silicon, cobalt, nickel, ruthenium, selenium, tin, alloys thereof, combinations thereof, or the like. The frame 460 may be surface treated to increase friction thereof, which may be advantageous to improve adhesion of particles to the frame 460. For example, the frame 460 may be brushed or may be porous or include partial openings (e.g., grooves) that increase surface area of the frame 460, which may be advantageous to increase ability of the frame 460 to trap the particles. The frame 460 generally does not include openings or holes that extend fully through the frame 460, so as to avoid the passage of particles through the frame 460 as illustrated in FIG. 3F.

The frame 460 does not include a pellicle, which is advantageous for reducing power loss that occurs due to imperfect transparency of the pellicle. For example, the material of the pellicle itself may not be fully transparent, but may have 98% transparency or less. For example, accumulation of particles on the inside and/or outside surfaces of the pellicle reduces output power, as described above with reference to FIG. 3G. As such, the frame 460 can increase power output of the lithography scanner, and does not suffer the control difficulties associated with use of the pellicle 370 described with reference to FIG. 3G.

Figure 4B:
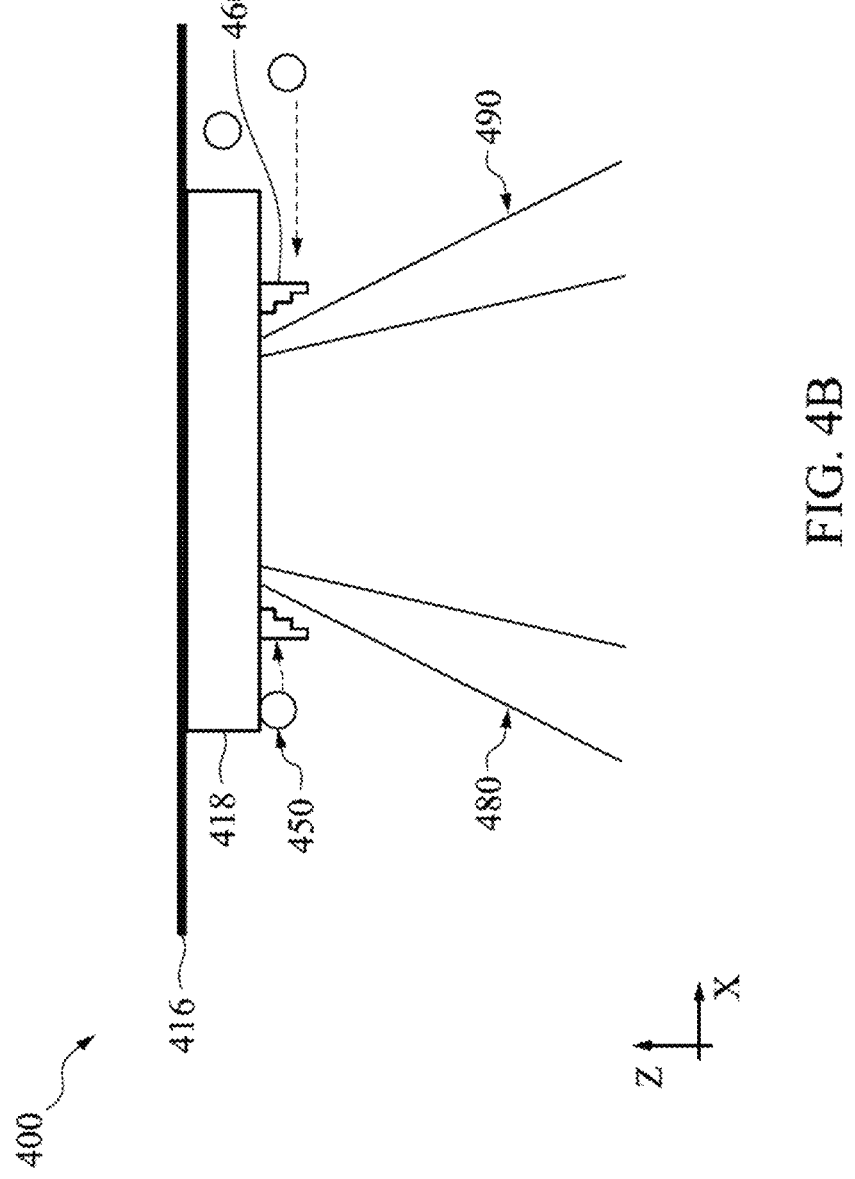
Figure 4C:
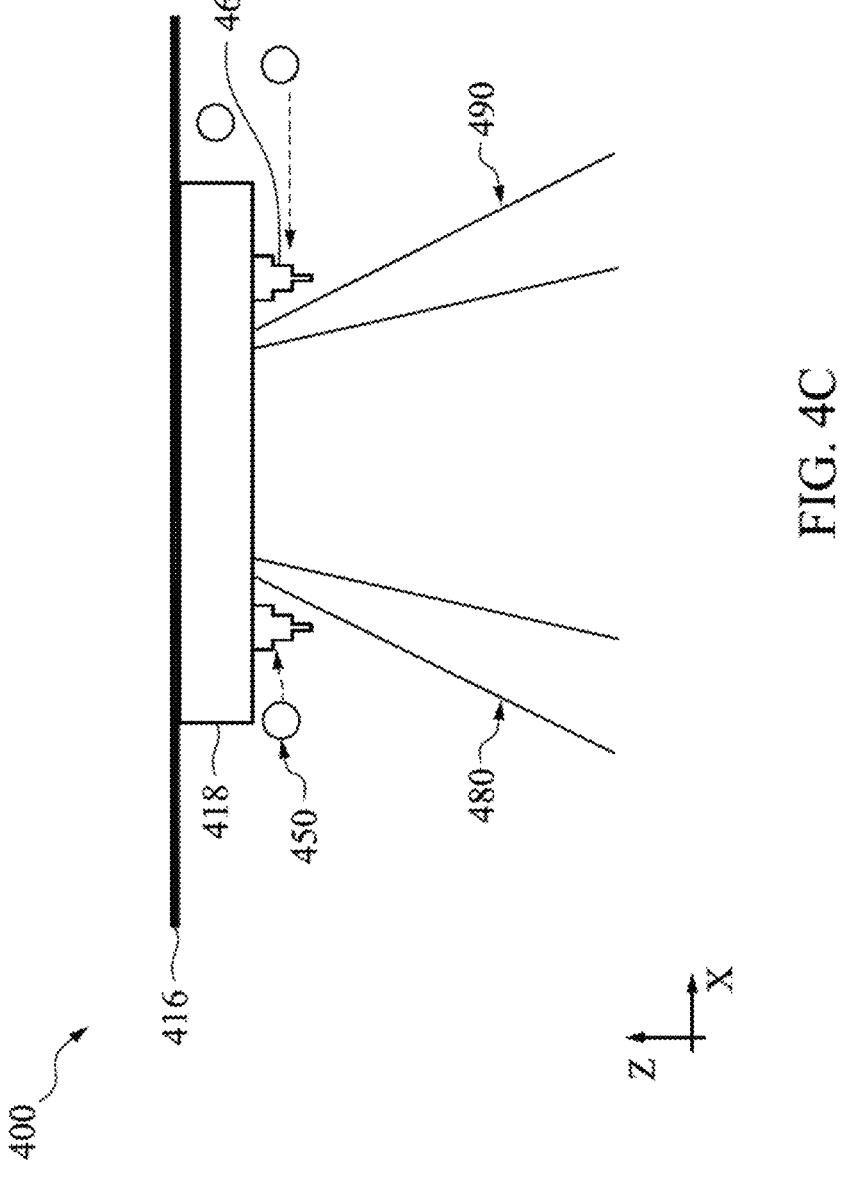

In FIGS. 4B and 4C, inner and/or outer sidewalls of the frame 460 may be tapered, which is advantageous to reduce blockage of the incident and exiting light 480, 490. The tapering may have a staircase profile as shown in FIG. 4B. In some embodiments, the tapering is smooth, such that the sidewalls have a smoothly sloped profile. FIG. 4C illustrates an embodiment in which inner and outer sidewalls of the frame 460 are tapered. The tapering in FIG. 4C may similarly have the staircase profile or a smooth profile, as just described.

Figure 4D:
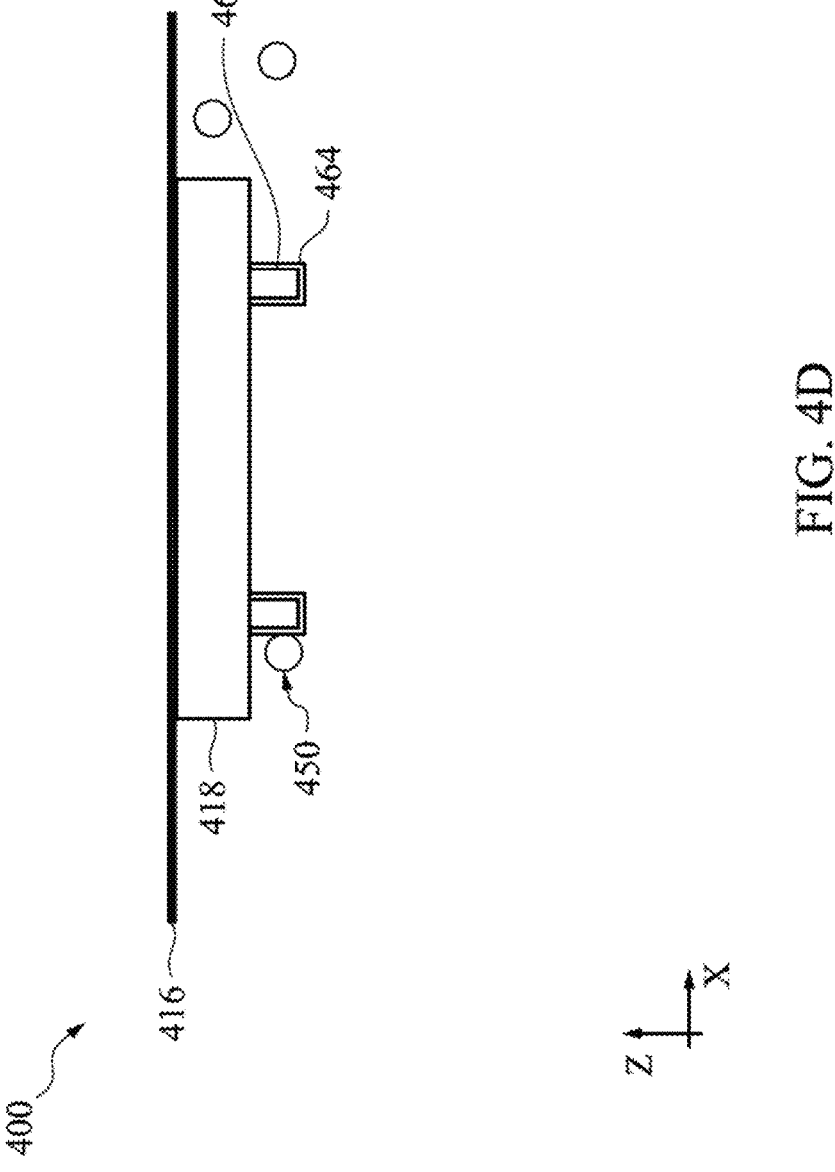

In FIG. 4D, an adhesive layer 464 may be disposed on the frame 460, as shown. The adhesive layer 464 may be advantageous to increase adhesion of the particles to the frame 460. In some embodiments, the adhesive layer 464 is or includes a glue, such as an acrylic adhesive, resin, polyvinyl acetate (PVA) or the like. In some embodiments, the adhesive layer 464 includes a carrier, such as a polymeric film, cloth, paper, foam or foil that is coated with an adhesive, such as a rubber, silicone or acrylic adhesive. In some embodiments, the adhesive layer 464 is disposed on at least three surfaces of the frame 460, such as an outer surface, an inner surface and a top surface, as shown. In some embodiments, one or more of the surfaces is free of the adhesive layer 464. For example, the adhesive layer 464 may be disposed only on the outside surface of the frame 460 (e.g., the surface to which a particle 450 is attached). For example, the adhesive layer 464 may be disposed on the outside surface and the inside surface of the frame 460. Generally, the adhesive layer 464 is disposed on the outside surface of the frame 460, which is the surface that will be in most frequent contact with the particles 450.

Figure 4E:
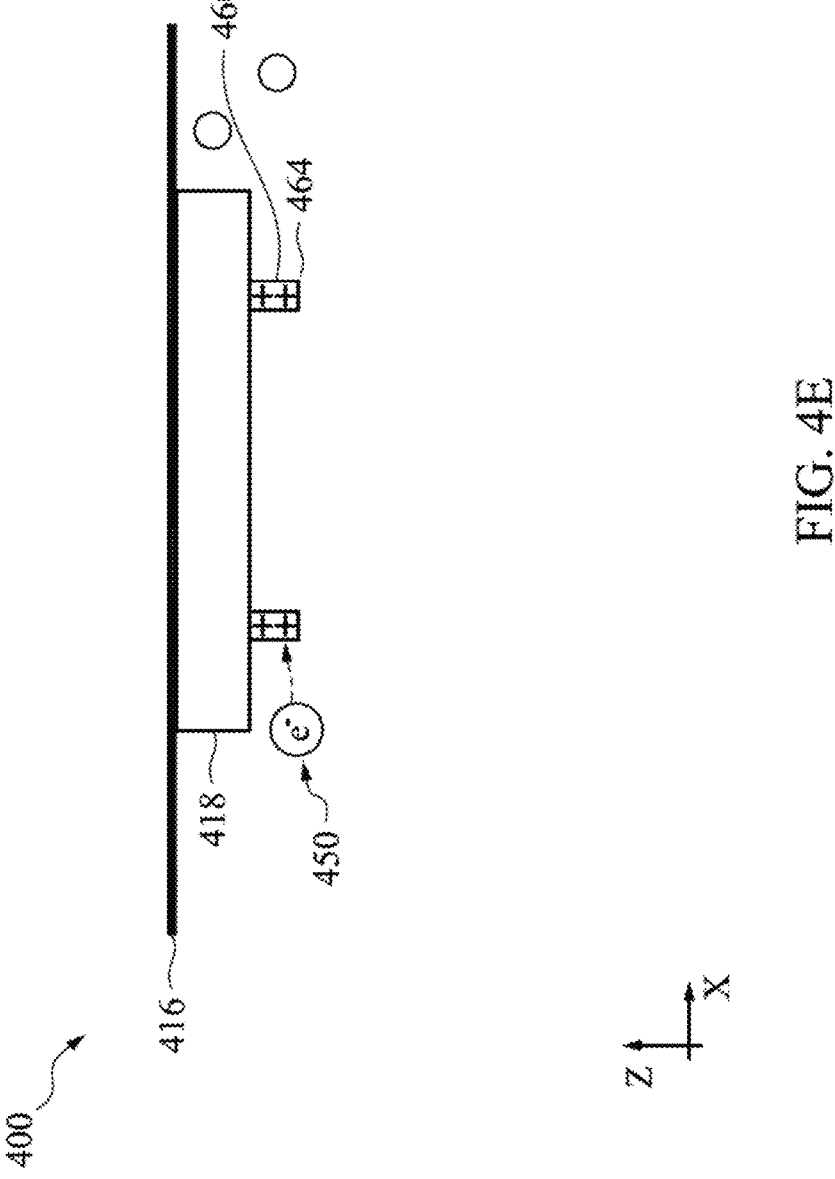

In FIG. 4E, the frame 460 may be electrically charged to increase electrical attraction between the frame 460 and the particles 450. For example, the frame 460 may be charged with a positive charge, which may be advantageous to attract the particles 450 that have a negative charge, as shown. It should be understood that the embodiments of FIGS. 4A-4E may be combined. For example, the frame 460 may be electrically charged with positive charge and may have the adhesive layer 464 disposed thereon, which may be advantageous to draw in the particles 450 by electromagnetic attraction and hold the particles 450 by the physical adhesion of the adhesive layer 464.

Figure 4F:
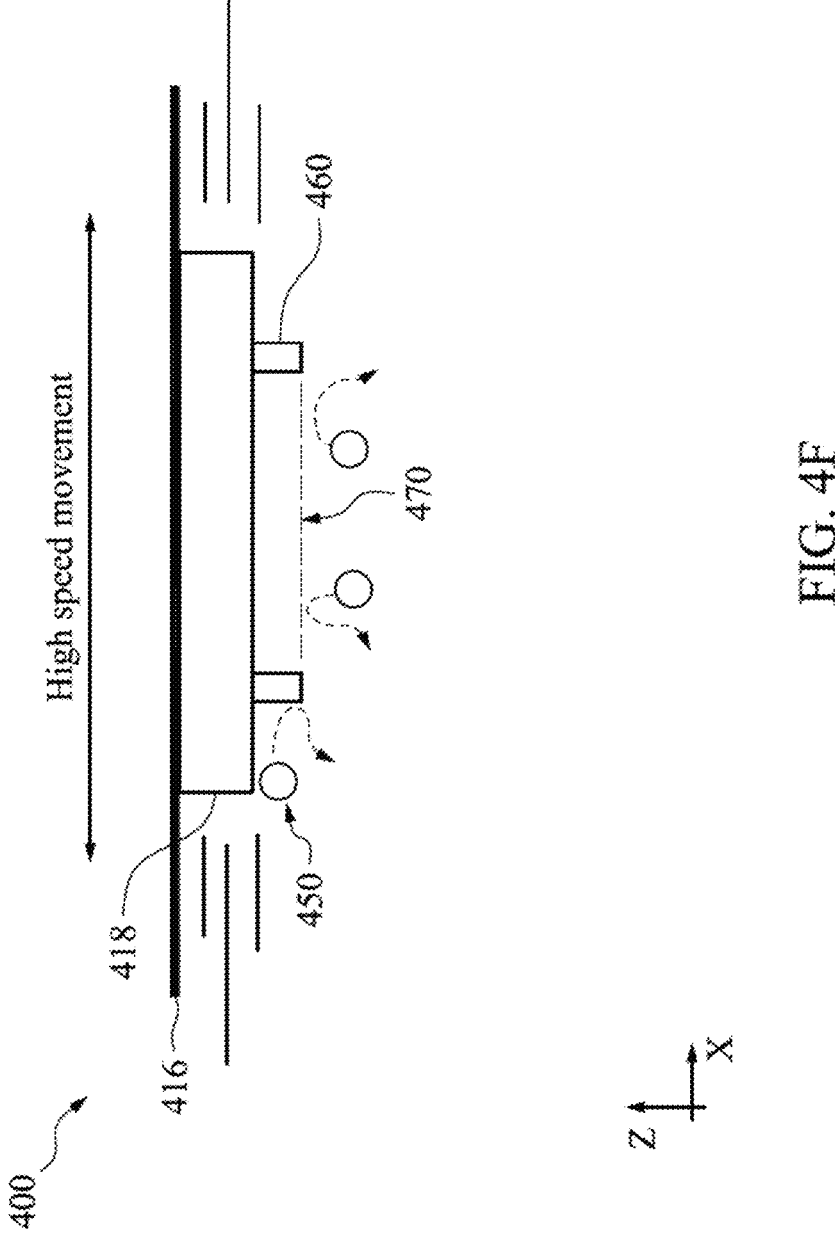

FIG. 4F is a diagram that illustrates a virtual or effective protective layer 470 that is present due to motion of the mask assembly 400 at high speeds in the XY plane. The protective layer 470 may be due to collision of the frame 460 with the particles 450. In some embodiments, a hydrogen gas flow is present inside the lithography scanner, such that the protective layer 470 may be due to flow of the hydrogen gas across the frame 460, which may carry the particles 450 in a direction away from the mask 418.

Figure 4G:
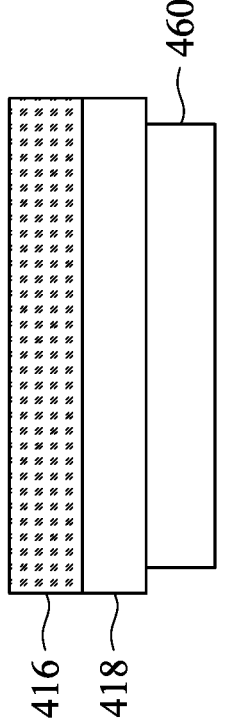

FIG. 4G shows a side view of the frame 460 in accordance with various embodiments. As described above, the frame 460 may be a single, continuous piece with no holes or openings therein that extend fully through the frame 460, e.g., in the X-axis direction, as shown, or in the Y-axis direction.

Figure 5:
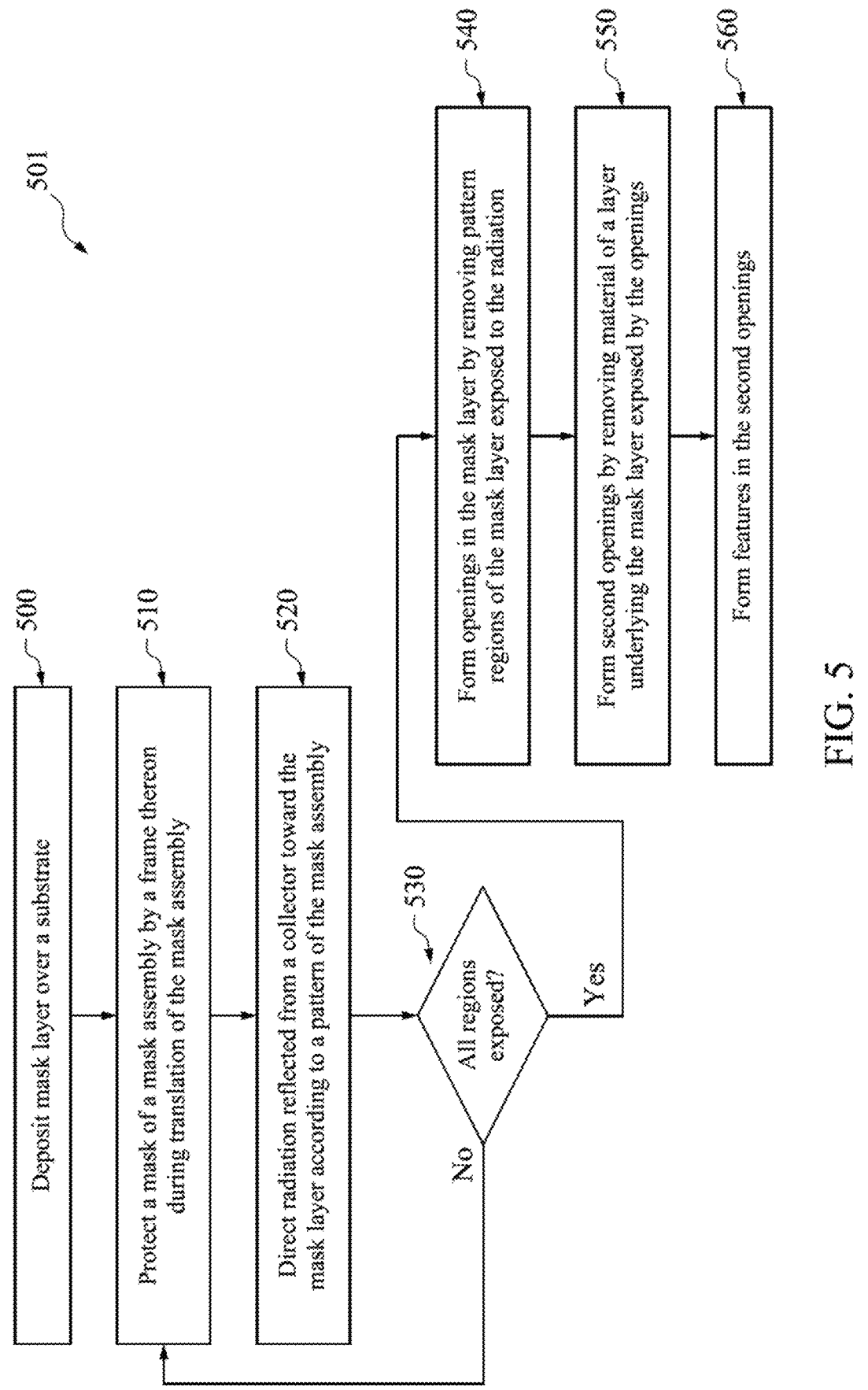
FIG. 5 is a view illustrating a method of fabricating a device according to various aspects of the present disclosure.

FIG. 5 is a flowchart of a process 501 for forming a device in accordance with various embodiments. In some embodiments, the process 501 for forming the device includes a number of operations (500, 510, 520, 530, 540, 550 and 560). The process 501 for forming the device will be further described according to one or more embodiments. It should be noted that the operations of the process 501 may be rearranged or otherwise modified within the scope of the various aspects. It should further be noted that additional processes may be provided before, during, and after the process 501, and that some other processes may be only briefly described herein. In some embodiments, the process 501 is performed by the lithography exposure system 10 described in FIGS. 1A-4G. The embodiments are described with reference to the structural elements described in FIGS. 1A-4G, but the process 501 may be performed by a lithography system having one or more structural elements that are different from those of the lithography system 10.

In operation 500, a mask layer (e.g., a mask layer 26 shown in FIG. 1A) is deposited over a substrate. In some embodiments, the mask layer 26 includes a photoresist layer that is sensitive to the EUV radiation 84. In some embodiments, the substrate is a semiconductor substrate, such as the semiconductor wafer 22 described with reference to FIGS. 1A and 1B. In some embodiments, the substrate is a layer overlying the semiconductor substrate, such as a dielectric layer, a metal layer, a hard mask layer, or other suitable layer. In some embodiments, the mask layer is deposited by spin coating or other suitable process.

In operation 510, the mask assembly 400 is translated so as to expose a region of the mask layer 26 on the substrate. For example, the mask assembly 400 may be translated in the X-axis direction, the Y-axis direction, or both. During translation of the mask assembly 400, the mask 418 thereof is protected by the frame 460 thereon. The mask 418 may be protected from the particles 450 by the frame 460. The protection may include deflecting one or more of the particles 450, adhering one or more of the particles 450, or both. The adhering may be physical by the frame 460 itself or by the adhesive layer 464 on the frame 460, or may be electromagnetic, as described with reference to FIGS. 4A-4E. The frame 460 is a pellicle-less frame.

In operation 520, radiation is reflected from the collector 60 and directed toward the mask layer 26. The radiation is reflected along an optical path between the collector 60 and the mask layer 26, which may be on the semiconductor wafer 22, such as that illustrated in FIG. 1A. In some embodiments, the radiation is reflected according to a pattern, such as exists on the mask 418, which may be a reflective mask. The radiation may be EUV light having wavelength centered at about 13.5 nm. The radiation may be directly incident on the mask 418 instead of passing through a transparent film, such as the pellicle 370. The radiation may directly exit the mask assembly 400 instead of passing again through the transparent film of the pellicle 370. As such, power of the radiation is conserved by use of the pellicle-less frame 460. Namely, a first reflector may direct (e.g., reflect) first radiation toward the mask 418. The first radiation may be directly incident on the mask 418. The first radiation is reflected by the mask 418 to form second radiation that carries the pattern of the mask 418. The second radiation is directed from the mask 418 toward a second reflector. The second radiation is directly incident on the second reflector. "Directly incident" includes the meaning that radiation does not pass through a film on its way from a first location to a second location. "Directly incident" may include the meaning that the radiation does pass through a gas or vacuum on its way from the first location to the second location. For example, the first and second radiation do not pass through a pellicle, but may pass through a hydrogen gas purge flow, which would be considered "directly incident."

In operation 530, if all regions of the mask layer 26 are exposed, the process 501 proceeds to operation 540. If one or more regions are yet unexposed, the process 501 proceeds to operation 510 to translate to a position associated with an unexposed region so as to expose the unexposed region.

In operation 540, openings are formed in the mask layer 26 by removing pattern regions of the mask layer 26 exposed to the radiation. In some embodiments, the openings are formed by removing regions of the mask layer 26 not exposed to the radiation.

In operation 550, material of one or more layers underlying the mask layer 26 is removed, forming second openings. The material removed is in regions of the layer exposed by the openings in the mask layer 26. In some embodiments, the layer is a dielectric layer, a semiconductor layer, or other layer.

In operation 560, features are formed in the second openings of the layer. For example, source/drain regions may be epitaxially grown in the second openings. For example, metal traces may be deposited in the second openings. For example, gate structures including a high-k dielectric layer and a metal layer may be formed in the second openings.

Embodiments may provide advantages. The pellicle-less frame 460 deflects and/or adheres particles. Not including a pellicle increases output power of the lithography scanner. Particle performance of the mask and the lithography scanner are improved. The pellicle-less frame 460 may be modified, such as heightened, thickened, changed in shape for fluid mechanics, and the like, to improve performance under a variety of operating conditions. The frame may have adhesive properties, such as by inclusion of the adhesive layer 464 or electrification of the frame 460.

In accordance with at least one embodiment, a method includes: depositing a mask layer over a substrate; protecting a mask of a mask assembly by a frame thereon during translating the mask assembly to a position associated with a region of the substrate; directing first radiation from a first reflector of a lithography system toward the mask, the first radiation passing from the first reflector to the mask to be directly incident on the mask; directing second radiation reflected from the mask toward a second reflector of the lithography system, the second radiation passing from the mask to the second reflector to be directly incident on the second reflector; reflecting radiation carrying a pattern of the mask toward the mask layer, the radiation being based on the second radiation; forming a first opening in the mask layer by removing a pattern region of the mask layer based on the pattern; forming a second opening by removing material of a layer underlying the mask layer exposed by the first opening; and forming a feature of a semiconductor device in the second opening.

In accordance with at least one embodiment, a method includes: protecting a mask of a mask assembly by a frame thereon during translating the mask assembly to a position associated with a region of a substrate, the frame having height less than a focal plane associated with a selected particle size; directing extreme ultraviolet (EUV) radiation toward the mask; reflecting radiation carrying a pattern of the mask toward the mask layer; forming a feature of a semiconductor device in a layer underlying the mask layer according to the pattern.

In accordance with at least one embodiment, a method includes: positioning a mask assembly at a first position associated with a first region of a mask layer overlying a substrate; exposing the first region by first extreme ultraviolet (EUV) light carrying a pattern of the mask assembly; protecting mask patterns of a mask of the mask assembly while translating the mask assembly from the first position to a second position associated with a second region of the mask layer, the protecting being by a frame attached to the mask, the frame being formed of a conductive material; and exposing the second region by second EUV light carrying the pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

depositing a mask layer over a substrate;

protecting a mask of a mask assembly by a pellicle-less frame thereon during translating the mask assembly to a position associated with a region of the substrate, wherein the pellicle-less frame is free of a pellicle membrane spanning the frame;

directing first radiation from a first reflector of a lithography system toward the mask, the first radiation passing from the first reflector to the mask to be directly incident on the mask;

directing second radiation reflected from the mask toward a second reflector of the lithography system, the second radiation passing from the mask to the second reflector to be directly incident on the second reflector;

reflecting radiation carrying a pattern of the mask toward the mask layer, the radiation being based on the second radiation;

forming a first opening in the mask layer by removing a pattern region of the mask layer based on the pattern;

forming a second opening by removing material of a layer underlying the mask layer exposed by the first opening; and forming a feature of a semiconductor device in the second opening.

2. The method of claim 1, wherein the protecting the mask includes deflecting a particle by the frame.

3. The method of claim 1, wherein the protecting the mask includes adhering a particle by the frame.

4. The method of claim 3, wherein the adhering includes adhering by an adhesive layer disposed on the frame.

5. The method of claim 3, wherein the adhering includes establishing an electrical charge on the frame, the electrical charge being opposite that of the particle.

6. The method of claim 3, wherein the adhering includes trapping the particle in a porous surface of the frame.

7. The method of claim 1, wherein the protecting the mask includes deflecting a particle by a gas flow associated with movement of the frame.

8. A method, comprising:

protecting a mask of a mask assembly by a pellicle-less frame thereon during translating the mask assembly to a position associated with a region of the substrate, the frame having height less than a focal plane associated with a selected particle size, and the frame being free of a pellicle membrane spanning the frame;

directing extreme ultraviolet (EUV) radiation toward the mask;

reflecting radiation carrying a pattern of the mask toward a mask layer;

forming a feature of a semiconductor device in a layer underlying the mask layer according to the pattern.

9. The method of claim 8, wherein the protecting the mask by the frame is by the frame having height less than about 1.5 millimeters.

10. The method of claim 8, wherein the protecting the mask by the frame is by the frame having tapered inner sidewalls.

11. The method of claim 10, wherein the tapered inner sidewalls have staircase profile.

12. The method of claim 10, wherein the protecting the mask by the frame is by the frame further having tapered outer sidewalls.

13. The method of claim 10, wherein the protecting the mask by the frame is by the frame having an adhesive layer disposed thereon.

14. The method of claim 10, wherein the protecting the mask by the frame is by the frame having an electrical charge thereon.

15. A method, comprising:

positioning a mask assembly at a first position associated with a first region of a mask layer overlying a substrate;

exposing the first region by first extreme ultraviolet (EUV) light carrying a pattern of the mask assembly;

protecting mask patterns of a mask of the mask assembly while translating the mask assembly from the first position to a second position associated with a second region of the mask layer, the protecting being by a pellicle-less frame attached to the mask, the pellicle-less frame being formed of a conductive material and being free of a pellicle membrane spanning the frame; and exposing the second region by second EUV light carrying the pattern.

16. The method of claim 15, wherein the protecting is by the pellicle-less frame deflecting a particle.

17. The method of claim 16, wherein the protecting is by the frame having height less than about 1 millimeter.

18. The method of claim 17, wherein the protecting is by the frame having tapered inner sidewalls.

19. The method of claim 18, wherein the protecting is by the frame having an adhesive layer thereon.

20. The method of claim 19, wherein the protecting is by the frame having an electrical charge thereon.

* * * * *